United States Patent [19]

Hayakawa et al.

[11] Patent Number: 4,694,460
[45] Date of Patent: Sep. 15, 1987

[54] STRIPE GEOMETRY SEMICONDUCTOR LASER DEVICE

[75] Inventors: Toshiro Hayakawa; Takahiro Suyama; Saburo Yamamoto, all of Nara, Japan

[73] Assignee: Sharp Kabushiki Kaisha, Osaka, Japan

[21] Appl. No.: 725,094

[22] Filed: Apr. 18, 1985

[30] Foreign Application Priority Data

Apr. 26, 1984 [JP] Japan .................................. 59-86700

[51] Int. Cl.⁴ ............................................... H01S 3/19
[52] U.S. Cl. .......................................... 372/45; 372/46
[58] Field of Search ....................... 372/45, 46; 357/17

[56] References Cited

U.S. PATENT DOCUMENTS 4,615,032 9/1986 Holbrook et al. .................... 372/45

FOREIGN PATENT DOCUMENTS 2643503 4/1977 Fed. Rep. of Germany .
2701102 7/1977 Fed. Rep. of Germany .

OTHER PUBLICATIONS

I. P. Kaminow et al., "Performance of an Improved InGaAsP Ridge Waveguide Laser at 1-3 mum", Electronics Letters, vol. 17, No. 9, Apr. 1981, pp. 318-320.
I. P. Kaminow et al., "Low-Threshold InGaAsP Ridge Waveguide Lasers at 1.3 mum", IEEE Journal of Quantum Electronics, vol. QE-19, No. 8, Aug. 1983, pp. 1312-1319.
Patent Abstracts of Japan, vol. 5, No. 197, Dec. 15th, 1981.

*Primary Examiner*—James W. Davie
*Attorney, Agent, or Firm*—Spencer & Frank

[57] ABSTRACT

A stripe geometry semiconductor laser comprising a multi-layered crystal structure having a substrate and an active layer for laser oscillation; an etching blocking layer on said multi-layered crystal structure; and a striped mesa-type multi-layered crystal having a cladding layer, which serves as an electroconductive region, on said etching blocking layer, resulting in a difference in the distribution of the refractive index of light with regard to the active layer between the inside and the outside of said striped mesa-type multi-layered crystal.

17 Claims, 5 Drawing Figures

STRIPE GEOMETRY SEMICONDUCTOR LASER DEVICE

BACKGROUND OF THE INVENTION

1. Field of the Invention:

This invention relates to a semiconductor laser having a structure, which is effective to control the transverse mode of laser oscillation and reduce the level of the threshold current, by the use of a crystal growth technique for the formation of thin films such as molecular beam epitaxy or metal-organic chemical vapor deposition.

2. Description of the Prior Art:

Recently, single crystal growth techniques for the formation of thin films, such as molecular beam epitaxy (MBE), metal-organic chemical vapor deposition (MO-CVD), etc. have been developed which enable the formation of thin film growth layers having a thickness of as thin as approximately 10Å. The development of such techniques although these significantly thin films have not yet been produced by liquid phase epitaxy (LPE), allowed thin films to be applied to lasers, resulting in laser devices exhibiting new laser effects and/or superior laser characteristics. A typical example of these new laser devices is a quantum well (QW) laser, which is produced based on the fact that quantization levels are established in its active layer by reducing the thickness of the active layer from several hundred Å to approximately 100Å or less, and which is advantageous over conventional double heterostructure lasers in that the threshold current level is low and the temperature and transient characteristics are superior. Such a quantum well laser is described in detail in the following papers:

(1) W. T. Tsang, Applied Physics Letters, vol. 39, No. 10 pp.786 (1981), (2) N. K. Dutta, Journal of Applied Physics, vol. 53, No. 11, pp. 7211 (1982), and (3) H. Iwamura, T. Saku, T. Ishibashi, K. Otuka, Y. Horikoshi, Electronics Letters, vol. 19, No. 5, pp. 780 (1983).

As mentioned above, the single crystal growth techniques, such as molecular beam epitaxy or metal-organic chemical vapor deposition, have resulted in the practical use of high quality semiconductor lasers having a new multiple-layered structure. However, these semiconductor lasers are deficient in that the stabilized transverse mode of laser oscillation cannot be attained due to the multiple-layered structure.

One of the most important points requiring improvement in other conventional semiconductor lasers which are in practical use, is stabilization of the transverse mode of the laser oscillation. A contact stripe geometric laser, which was developed in the early stage of laser development, has a striped electrode to prevent electric current injected from transversely expanding, and attains laser oscillation in a zero order mode (i.e., the fundamental transverse mode) upon exceeding the threshold current level, due to the fact that gains required for laser oscilation are greater than losses within the active region underneath the stripe region, while the said contact stripe geometric laser produces laser oscillation in an expanded transverse mode or a higher-order transverse mode with an increase in the injection of current beyond the threshold current level, because carriers which are injected into the active layer spread to the outside of the striped region resulting in expanding the high gain region. Due to such an unstable transverse mode and dependency of the transverse mode upon the amount of injected electric current, the linear relationship between the injected electric current and the laser output decreases. Moreover, the laser output resulting from pulse modulation is unstable so that the signal-noise ratio is reduced and its directivity becomes too unstable to be used in an optical system such as optical fibers, etc. In order to overcome the above-mentioned practical drawbacks of contact stripe geometric lasers, a variety of structures for semiconductor lasers of GaAlAs and/or InGaAsP systems have been already produced by liquid phase epitaxy, which prevent not only electric current but also light from transversely expanding thereby attaining stabilization in the transverse mode. However, most of these semiconductor lasers can only be produced by the growth of thin film layers on a grooved substrate, a mesa substrate or a terraced substrate based on a peculiarity of the liquid phase epitaxy, typical examples of which are channel-substrate planar structure injection lasers (CSP lasers) (K. Aiki, M. Nakamura, T. Kuroda and J. Umeda, Applied Physics Letters, vol. 30, No. 12, pp. 649 (1977)), constricted double heterojunction lasers (CDH lasers) (D. Botez, Applied Physics Letters, vol. 33, pp. 872 (1978)) and terraced substrate lasers (TS lasers) (T. Sugino, M. Wada, H. Shimizu, K. Itoh, and I. Teramoto, Applied Physics Letters, vol. 34, No. 4, (1979)). All of these lasers can be only produced utilizing anisotrophy of the crystal growth rate, but can not be produced by the use of a crystal growth technique such as molecular beam epitaxy (MBE) or metal-organic chemical vapor deposition (MO-CVD).

FIG. 1 shows a conventional semiconductor laser of a GaAlAs system which achieves a stabilized transverse mode, which can be produced as follows: On an n-GaAs substrate 1, an n-GaAs buffer layer 1', an n-Ga$_{0.7}$Al$_{0.3}$As cladding layer 2, an n-GaAs active layer 3, a p-Ga$_{0.7}$Al$_{0.3}$As cladding layer 4 and a p-GaAs cap layer 5 are successively grown by molecular beam epitaxy, followed by a successive vacuum evaporation of each of Al, Zn and Au to form an electrode layer thereon which is then subjected to a photolithography treatment to form a striped electrode layer 20. The resulting semiconductor layer is etched by an Ar ion etching technique using the striped electrode layer 20 as a masking means to thereby form a striped portion 10 which serves as an optical waveguide. The cladding layer 4 on both sides of the striped portion 10 has a thickness of approximately 0.3 μm. The striped electrode layer 20 is heated to be an alloy. Then, a SiO$_2$ film 6 is formed on the cladding layer 4 on both sides of the striped portion 10. A Cr/Au electrode 8 and an AuGe/Ni electrode 7 are formed on the p-side (i.e., the striped portion 10 and the SiO$_2$ film 6) and the n-side (i.e., the bottom of the substrate 1), respectively, resulting in a semiconductor laser. Such a semiconductor laser exhibits stabilized characteristics. However, since the difference in the built-in refractive index in the optical waveguide is dependent upon the accuracy of the depth of the etching by an Ar ion beam etching technique, the control of the difference in the refractive index is so difficult that reproducible oscillation in the fundamental transverse mode cannot be attained. Moreover, control of the oscillation at a high output power is difficult because the difference in the refractive index must be minimized to attain oscillation at a high output power.

SUMMARY OF THE INVENTION

The semiconductor laser of this invention which overcomes the above-discussed disadvantages and numerous other drawbacks and deficiencies of the prior art, comprises a stripe geometry semiconductor laser including a multi-layered crystal structure having an active layer for laser oscillation; an etching blocking layer on said multi-layered crystal structure; and a striped mesa-type multi-layered crystal having a cladding layer, which serves as an electroconductive region, disposed on said etching blocking layer, resulting in a difference in the distribution of the refractive index of light with regard to the active layer between the inside and the outside of said striped mesa-type multi-layered crystal.

Optical guiding layers are, in a preferred embodiment, disposed in a manner to contact said active layer in the multi-layered crystal structure and said cladding layer in the striped mesa-type multi-layered crystal, resulting in a large optical cavity structure to thereby attain an optical amplifying effect.

The multi-layered crystal structure is one selected from the groups consisting of the GaAlAs, InGaAlP and InGaAsP systems.

Thus, the invention described herein makes possible the objects of (1) providing a semiconductor laser having a structure which is effective to control the transverse mode of laser oscillation and reduce the level of the threshold current by the use of a crystal growth technique for the formation of thin films such as molecular beam epitaxy or metal-organic chemical vapor deposition; and (2) providing a semiconductor laser having uniform characteristics.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
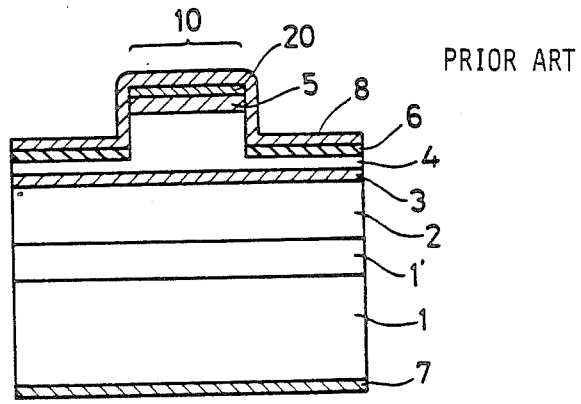
FIG. 1 is a sectional view of a conventional semiconductor laser which was produced by molecular beam epitaxy.
Figure 2A:
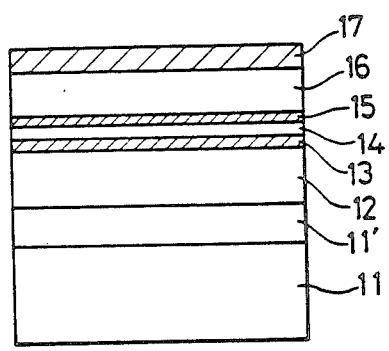
FIGS. 2(a), (b) and (c), respectively, are diagramatical sectional views showing the production process of a semiconductor laser according to this invention.
Figure 2B:
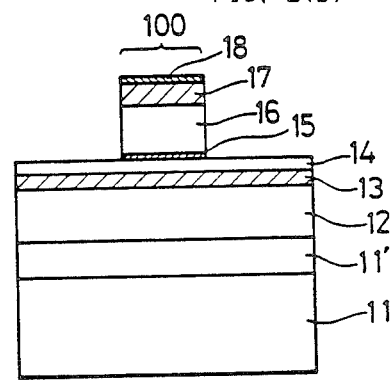
Figure 2C:
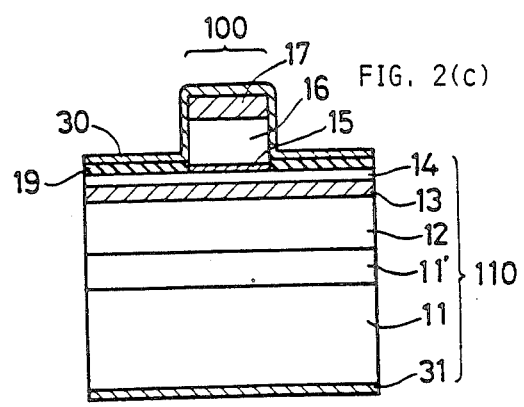

FIG. 2(c) shows a semiconductor laser of this invention, which comprises a multi-layered crystal structure 110, having an active layer 13 for laser oscillation, an etching blocking layer 15 and a striped mesa-type multi-layered crystal 100 serving as an electroconductive region. The multi-layered crystal structure 110 comprises an n-GaAs substrate 11, an n-GaAs buffer layer 11', an n-GaAlAs cladding layer 12, a GaAs active layer 13, and a p-GaAlAs cladding layer 14, successively. The striped mesa-type multi-layered crystal 100 comprises a p-GaAlAs cladding layer 16 and a p-GaAs cap layer 17, successively.

This semiconductor laser is produced as follows:

As shown in FIG. 2(a), on the n-GaAs substrate 11, the n-GaAs buffer layer 11' having a thickness of 0.5 $\mu$m, the h-$Ga_{0.7}Al_{0.3}As$ cladding layer 12 having a thickness of 1 $\mu$m, the non-doped GaAs active layer 13 having a thickness of 0.07 $\mu$m, the p-$Ga_{0.7}As$ cladding layer 14 having a thickness of 0.3 $\mu$m, the p-GaAs etching blocking layer 15 having a thickness of 0.02 $\mu$m, the p-$Ga_{0.5}Al_{0.5}As$ cladding layer 16 having a thickness of 1 $\mu$m and the p-GaAs cap layer 17 having a thickness of 0.2 $\mu$m are successively grown by molecular beam epitaxy to form a double heterostructure multi-layered crystal 110 for laser oscillation. Thereafter, as shown in FIG. 2 (b), a striped photo-resist layer 18 is formed on the cap layer 17 by a photolithography method, followed by etching using an etchant (e.g., $H_2SO_4$: $H_2O_2$: $H_2O = 10:1:1$) to etch the region other than the striped photo-resist 18 to the extent of a depth of approximately 1 $\mu$m. Then, using an etchant such as a hydrofluoric acid (HF) solution which does not etcht the GaAs crystal but etches the $Ga_{0.5}Al_{0.5}As$ crystal selectively, the remaining p-$Ga_{0.5}Al_{0.5}As$ crystal except for the portion of the p-$Ga_{0.5}Al_{0.5}As$ cladding layer 16 underneath the striped photo-resist layer 18 is etched until reaching the GaAs etching blocking layer 15, and thereafter selectively GaAs using an etchant such as a mixture of a hydrogen peroxide solution and an ammonia solution ($H_2O_2$: $NH_4OH = 5:1$), so that the GaAs etching blocking layer 15, except for that portion underneath the striped photo-resist layer 18, is removed. According to the above-mentioned process, the p-cladding layer 16 can be etched separately from the other p-cladding layer 14 due to the existence of the thin etching blocking layer 15 therebetween, resulting in the portion of the thin p-GaAlAs cladding layer 14 outside the striped portion 100 having a thickness which accurately corresponds to that at the time when the growth of the p-GaAlAs cladding layer 14 had been completed, and portion of the thick p-GaAlAs cladding layer 16 in the inside of the striped portion 100 having a thickness which also accurately corresponds to that at the time when the growth thereof had been completed.

Then, as shown in FIG. 2(c), the surface of the p-cladding layer 14 around the striped portion 100 is coated with an insulating film 19. As the insulating film 19, a spontaneous oxidation film which can be formed by the oxidation of the $Ga_{0.7}Al_{0.3}As$ crystal constituting the p-cladding layer 14 is employed. The insulating film 19 can also formed in such a manner that the whole surface of the p-cladding layer 14 including the striped portion 100 is coated with an insulating film made of a metal oxidation film such as $SiO_2$, etc. and the insulating film on the cap layer 17 in the striped portion 100 is then removed together with the photo-resist 18 by a lift-off method. Alternatively, the insulating layer 19 such as $SiO_2$, etc. can be formed directly on the etching blocking layer 15 around the striped portion 100 thereby eliminating the need to remove the etching blocking layer 15.

Finally, a p-Cr/Au electrode 30 is formed on the whole surface of the insulating layer 19 and the cap layer 17, and an n-AuGe/Ni electrode 31 is formed on the back of the GaAs substrate 11, followed by cleaving at the facets resulting in a semiconductor laser.

A current, which is injected into the semiconductive laser via the p-electrode 30 and the n-electrode 31, flows through the striped portion 100 serving as an electroconductive region and laser oscillation is carried out in the active layer 13.

Figure 3:
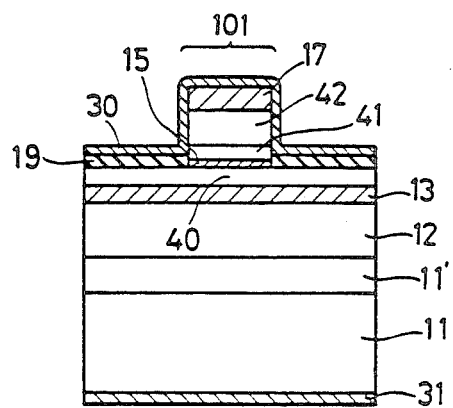
FIG. 3 is a sectional view showing another semiconductor laser according to this invention.

FIG. 3 shows another semiconductor laser of this invention, wherein p-$Ga_{0.85}Al_{0.15}As$ optical guiding layers 40 and 41, respectively are disposed in a manner to contact the center portion of the active layer 13 corresponding to the striped portion 101 and the p-cladding layer 42 in the striped portion 101, resulting in a large optical cavity structure. Such an optical guiding layer can be disposed between the center portion of the active layer 13 and the center portion of the n-cladding layer 12. These optical guiding layers 40 and 41, constituting a large optical cavity structure, function to attain the excudation of light from the active layer 13 to the outside to thereby increase the optically amplifying effect, resulting in a semiconductor laser which can withstand operations at a high output power. Both side areas of the optical guiding layer 40 have a refractive index, which is smaller than that of the center portion thereof, and serve as cladding layers.

The difference in the built-in refractive index of the above-mentioned semiconductor laser, which is significant for light to be confined in the active layer 13, depends considerably upon the thickness of the p-cladding layer 14 or the optical guiding layer 40 outside the striped portion 100 or 101. That is, by controlling the thickness of the p-cladding layer 14 or the optical guiding layer 40, laser oscillation in the fundamental transverse mode can be attained. A crystal growth technique for the formation of thin films such as molecular beam epitaxy, metal-organic chemical vapor deposition, etc., enables the accurate formation of thin film growth layers having a thickness as thin as approximately 10Å. Using such a crystal growth technique, the semiconductor laser of this invention is constructed such that the thicknesses of the p-cladding layers 14 and 16 and/or the optical guiding layers 40 and 41 are different on the outside and the inside of the striped portion 100 and/or 101, resulting in a different distribution of the refractive index of light with regard to the active layer 13 between the outside and the inside of the striped portion 100 and/or 101, thereby improving the control of the fundamental transverse mode of laser oscillation.

Since the semiconductor laser of this invention is produced using a crystal growth technique such as molecular beam epitaxy or metal-organic chemical vapor deposition, the etching blocking layer 15 has a thickness as thin as approximately 200Å so that the distribution of the thicknesses of the cladding layers and the optical guiding layers can be controlled with excellent accuracy without an effect of the etching blocking layer 15 on the optical characteristics of the semiconductor laser. If the semiconductor laser was produced using a crystal growth technique such as liquid phase epitaxy, the thickness of the resulting etching blocking layer could not be 200Å or less so that the etching blocking layer produces an unfavorable effect on the optical characteristics (such as the loss of current in the oscillation region).

The semiconductor laser of this invention is also applicable to mixed crystals such as the InGaAlP system, the InGaAsP system, etc., instead of the GaAlAs system. A quantum well heterostructure can be, of course, applied to the active region, resulting in a semiconductor laser having improved laser-characteristics.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

We claim:

1. In a stripe geometry semiconductor laser: a multi-layered crystal structure having a substrate and an active layer for laser oscillation; an etching blocking layer on said multi-layered crystal structure; and a striped mesa-type multi-layered crystal, including a cladding layer, which serves as an electroconductive region and is disposed on said etching blocking layer, resulting in a difference in the distribution of the refractive index of light with regard to the active layer between the inside and the outside of said striped mesa-type multi-layered crystal.

2. A semiconductor laser according to claim 1, wherein optical guiding layers are disposed in a manner to contact said active layer in the multi-layered crystal structure and said cladding layer in the striped mesa-type multi-layered crystal, resulting in a large optical cavity structure to thereby attain an optical amplifying effect.

3. A semiconductor laser according to claim 1, wherein said multi-layered crystal structure is one selected from the groups consisting of the GaAlAs, InGaAlP and InGaAsP systems.

4. A semiconductor laser according to claim 1, wherein said multi-layered crystal structure comprises an n-GaAs substrate, an n-GaAs buffer layer, an n-GaAlAs cladding layer, a GaAs active layer, and a p-GaAlAs cladding layer, successively, and said striped mesa-type multi-layered crystal comprises a p-GaAlAs cladding layer and a p-GaAs cap layer, successively.

5. A semiconductor laser according to claim 4, wherein a p-optical guiding layer is disposed on the center portion of the GaAs active layer corresponding to the striped mesa-type multi-layered crystal and another p-optical guiding layer is disposed between the etching blocking layer and the p-GaAlAs cladding layer in the striped mesa-type multi-layered crystal.

6. A semiconductor laser according to claim 4 wherein said etching blocking layer comprises p-GaAs.

7. A semiconductor laser according to claim 1 wherein said etching blocking layer comprises a semiconductor crystalline layer formed of a different material than the adjacent layer of said multi-layered crystal structure and the adjacent layer of said striped mesa-type multi-layered crystal.

8. A semiconductor laser according to claim 7 wherein said etching blocking layer has a thickness of approximately $0.02\mu$.

9. A semiconductor laser according to claim 1 wherein said etching blocking layer extends only beneath said striped mesa-type multi-layered crystal.

10. In a stripe geometry semiconductor laser device comprising a multi-layered crystal structure having a substrate and an active layer for laser oscillation, and a striped mesa-type multi-layered crystal, including a cladding layer, which serves as an electroconductive region and is disposed on the top layer of said multi-layered crystal structure, resulting in a difference in the distribution of the refractive index of light with regard to the active layer between the inside and the outside of said striped mesa-type multi-layered crystal; the improvement wherein the bottom layer of said striped mesa-type multi-layered crystal is an etching blocking layer.

11. A stripe geometry semiconductor laser device according to claim 10, wherein said top layer of said multi-layered crystal structure is an optical guiding layer, and a further optical guiding layer is disposed between said etching blocking layer and said cladding layer in said striped mesa-type multi-layered crystal, resulting in a large optical cavity structure to thereby attain an optical amplifying effect.

12. A stripe geometry semiconductor laser device according to claim 10, wherein said top layer of said multi-layered crystal structure is a further cladding layer.

13. A stripe geometry semiconductor laser according to claim 10, wherein said multi-layered crystal structure is one selected from the groups consisting of the GaAlAs, InGaAlP and InGaAsP systems.

14. A stripe geometry semiconductor laser according to claim 10, wherein said multi-layered crystal structure comprises an n-GaAs substrate, an n-GaAs buffer layer, an n-GaAlAs cladding layer, a GaAs active layer, and a p-GaAlAs cladding layer, successively, and said striped mesa-type multi-layered crystal comprises a p-GaAs etching blocking layer, a p-GaAlAs cladding layer and a p-GaAs cap layer, successively.

15. A stripe geometry semiconductor laser according to claim 14 wherein a p-optical guiding layer is disposed on the center portion of the GaAs active layer corresponding to the striped mesa-type multi-layered crystal and another p-optical guiding layer is disposed between the etching blocking layer and the p-GaAlAs cladding layer in the striped mesa-type multi-layered crystal.

16. A stripe geometry semiconductor laser according to claim 10 wherein said etching blocking layer has a thickness of approximately $0.02\mu$.

17. A stripe geometry semiconductor laser according to claim 10 wherein said etching blocking layer is formed of a different semiconductor material than said top layer of said multi-layered crystal structure and than the adjacent layer of said striped mesa-type multi-layered crystal.

* * * * *